United States Patent [19]

Kunst et al.

[11] Patent Number: 5,930,170
[45] Date of Patent: Jul. 27, 1999

[54] VOLTAGE SELECTION CIRCUIT SUITABLE FOR USE AS ESD PROTECTION CIRCUIT FOR EEPROM

[75] Inventors: David Jay Kunst; Greg Smith, both of Tucson, Ariz.

[73] Assignee: National Semiconductor Corporation, Santa Clara, Calif.

[21] Appl. No.: 08/651,392

[22] Filed: May 22, 1996

[51] Int. Cl.[6] .................................................. G11C 16/04
[52] U.S. Cl. .............................. 365/185.18; 365/185.23; 365/226
[58] Field of Search ..................... 365/185.18, 185.23, 365/226; 326/38; 327/407, 408

[56] References Cited

U.S. PATENT DOCUMENTS

| | | | |
|---|---|---|---|
| 5,243,490 | 9/1993 | Ontko et al. | 361/91 |
| 5,455,789 | 10/1995 | Nakamura et al. | 365/185.17 |
| 5,596,532 | 1/1997 | Cernea et al. | 365/185.18 |
| 5,671,179 | 9/1997 | Javanifard | 365/226 |
| 5,818,781 | 10/1998 | Estakhri et al. | 365/226 |

*Primary Examiner*—David Nelms
*Assistant Examiner*—Gene N. Auduong
*Attorney, Agent, or Firm*—Limbach & Limbach L.L.P.

[57] ABSTRACT

A static electrostatic discharge (ESD) protection circuit for the programming voltage line of an electrically erasable programmable read only memory (EEPROM) includes a pair of multiplexors consisting of MOS pass transistors for selecting between the power supply voltage and programming voltage to be supplied to the EEPROM for its normal and programming modes of operation, respectively. One of the multiplexors performs the voltage selection in accordance with an externally generated differential control signal and a biasing voltage from the second multiplexor. The second multiplexor, in accordance with one of the phases of the differential control signal, automatically selects either the power supply voltage or programming voltage, whichever is larger, for use as the biasing voltage supplied to the first multiplexor.

31 Claims, 6 Drawing Sheets

VOLTAGE SELECTION CIRCUIT SUITABLE FOR USE AS ESD PROTECTION CIRCUIT FOR EEPROM

BACKGROUND OF THE INVENTION

1. Field of the Invention

The present invention relates to signal selection circuits, and in particular, to signal selection circuits used for programmably selecting between multiple input voltages and suitable for use as electrostatic discharge (ESD) protection circuits for electrically erasable programmable read only memories (EEPROMs).

2. Description of the Related Art

Electrically erasable programmable read only memory circuits require a high programming voltage (e.g. 15 volts or more) which is often supplied by an external voltage source separate from the normal circuit power supply voltage source. Most products using EEPROM technology are designed and manufactured to operate with power supply voltages of five volts or less. High voltage transistors can be used to isolate the higher voltage EEPROM circuit from the native lower voltage devices. However, the integrated circuit chip pad used to bring in the higher programming voltage must be protected with a high voltage zener diode which is designed to break down at a voltage greater than the programming voltage. Accordingly, an ESD event can result in a high voltage momentarily powering up the EEPROM circuit and thereby altering the characteristics of the "core" memory transistors. Indeed, the original information stored in the EEPROM could possibly be erased or reprogrammed, thereby jeopardizing the reliability of the EEPROM as a result of such an ESD event.

Accordingly, it would be desirable to have a means by which an EEPROM circuit can be protected from ESD events as well as accidental erasure or reprogramming of its programmed information.

SUMMARY OF THE INVENTION

In accordance with one embodiment of the present invention, a voltage selection circuit with limited self-controlled input selection capability includes first, second and third nodes, and first and second selective coupling circuits. The first node is configured to receive and convey a first voltage, the second node is configured to receive and convey a second voltage, and the third node is configured to receive and convey third and fourth voltages for use by a user circuit, with the third and fourth voltages corresponding to and being approximately equal to the first and second voltages, respectively. The first selective coupling circuit is connected between the first, second and third nodes, and is configured to receive first, second and third control signals and in accordance therewith conductively couple the first node to the third node and thereby provide the third voltage thereto or conductively couple the second node to the third node and thereby provide the fourth voltage thereto. The first node is conductively coupled to the third node during assertions of the second and third control signals, and the second node is conductively coupled to the third node during assertion of the first control signal. The second selective coupling circuit is connected between the first node, second node and first selective coupling circuit, and is configured to receive the first control signal and provide the second control signal. The second control signal corresponds to and is approximately equal to the first voltage when the first voltage is greater than the second voltage, and the second control signal corresponds to and is approximately equal to the second voltage when the second voltage is greater than the first voltage.

In accordance with another embodiment of the present invention, an integrated circuit with a static electrostatic discharge (ESD) protection circuit for the programming voltage line of an electrically erasable programmable read only memory (EEPROM) includes a power node, a programming node, a bias node, a selective coupling circuit, a selective biasing circuit and a control circuit. The power node is configured to receive and convey a power supply voltage, the programming node is configured to receive and convey a programming voltage, and the bias node is configured to receive and convey first and second bias voltages for use by an EEPROM, with the first and second bias voltages corresponding to and being approximately equal to the power supply voltage and programming voltage, respectively. The selective coupling circuit is connected between the power node, programming node and bias node, and is configured to receive first, second and third control signals and in accordance therewith conductively couple the power node to the bias node and thereby provide the first bias voltage thereto, or conductively couple the programming node to the bias node and thereby provide the second bias voltage thereto. The power node is conductively coupled to the bias node during assertions of the second and third control signals, while the programming node is conductively coupled to the bias node during assertion of the first control signal. The selective biasing circuit is connected between the power node, programming node and selective coupling circuit, and is configured to receive the first control signal and provide the second control signal. When the power supply voltage is greater than the programming voltage, the second control signal corresponds to and is approximately equal to the power supply voltage, and when the programming voltage is greater than the power supply voltage, the second control signal corresponds to and is approximately equal to the programming voltage. The control circuit is coupled to the selective coupling circuit and selective biasing circuit and is configured to receive a mode signal and in accordance therewith provide the first and third control signals.

These and other features and advantages of the present invention will be understood upon consideration of the following detailed description of the invention and the accompanying drawings.

DETAILED DESCRIPTION OF THE INVENTION

Figure 1:
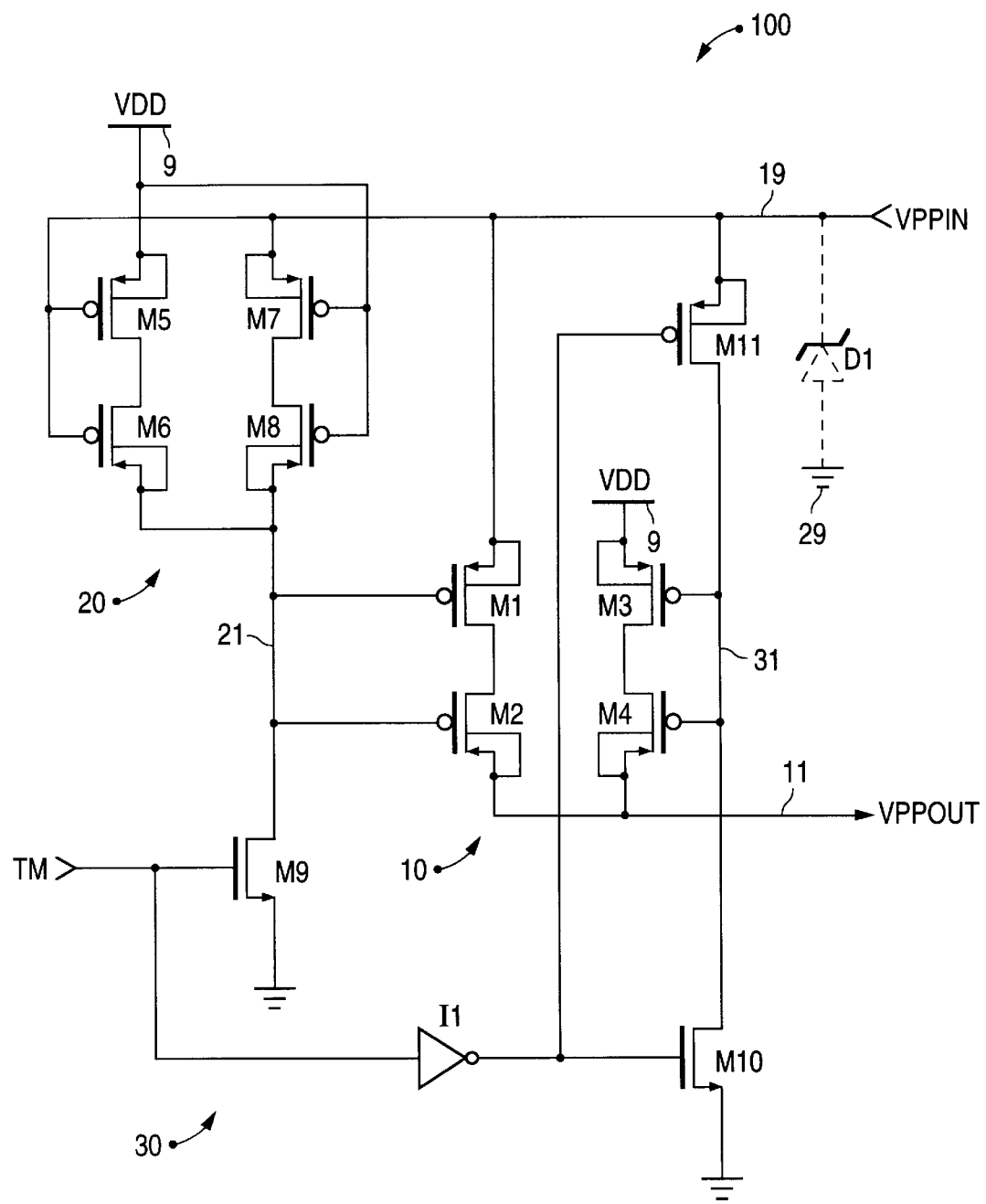
FIG. 1 is a schematic diagram of a voltage selection circuit in accordance with one embodiment of the present invention.

Referring to FIG. 1, a voltage selection circuit 100 in accordance with one embodiment of the present invention includes two selective coupling circuits 10, 20 interconnected between the nodes 9, 19 to which a power supply voltage VDD and programming voltage VPPIN are applied and an output node 11 by which a biasing or programming voltage VPPOUT is provided. (Typically, the programming node 19 is protected against ESD events by a zener diode D1 connected between the programming node 19 and circuit ground 29.) The first selective coupling circuit 10 includes a pair of totem-pole-connected P-MOSFETs M1, M2 connected between the programming node 19 and output node 11, and a pair of totem-pole-connected P-MOSFETs M3, M4 connected between the power supply node 9 and output node 11. The second selective coupling circuit 20 includes a pair of totem-pole-connected P-MOSFETs M5, M6 connected between the power supply node 9, programming node 19 and node 21, and another pair of P-MOSFETs M7, M8 also connected between the programming node 19, power supply node 9 and node 21. (As indicated in the figure, the bulks, or substrates, of the P-MOSFETs M1–M8 are connected directly to their respective source terminals.)

A control circuit 30, which includes N-MOSFETs M9, M10, P-MOSFET M11 and an inverter I1, interconnected as shown, drives nodes 21 and 31 which form the input terminals of the first selective coupling circuit 10 and the output terminal of the second selective coupling circuit 20. The input to the control circuit 30 is a test mode signal TM which, when asserted, causes the voltage selection circuit 100 to provide a programming voltage (VPPOUT≈VPPIN) at its output node 11, and which, when not asserted, causes the voltage selection circuit 100 to provide a biasing voltage (VPPOUT≈VDD) at the output node 11 (discussed in more detail below).

During the nonprogramming mode of operation, the test mode signal TM is not asserted, i.e. is low at a logic zero. Accordingly, N-MOSFETs M9 and M10 are turned off and on, respectively, and P-MOSFET M11 is turned off, thereby leaving node 21 floating and available to be driven by the second selective coupling circuit 20 and causing node 31 to be active low at a logic zero. This results in P-MOSFETs M3 and M4 in the first selective coupling circuit 10 being turned on, thereby conductively coupling the power supply node 9 to the output node 11. The second selective coupling circuit 20, meanwhile, finctions as an "intelligent" multiplexor which selects the greater of the two voltages VDD, VPPIN providing power to it. If VDD is greater than VPPIN, P-MOSFETs M5 and M6 are turned on, thereby conductively coupling the power supply node 9 to node 21. Conversely, if the programming voltage VPPIN is greater than the power supply voltage VDD, P-MOSFETs M7 and M8 are turned on, thereby conductively coupling the programming node 19 to node 21. The resulting voltage at node 21 causes P-MOSFETs M1 and M2 in the first selective coupling circuit to be turned off. Hence, the output voltage VPPOUT at the output node 11 is approximately equal to the power supply voltage VDD (albeit slightly less due to small voltage drops across the channels of P-MOSFETs M3 and M4).

During the test, or programming, mode of operation, the test mode signal TM is asserted, i.e. high at a logic one. Accordingly, N-MOSFETs M9 and M10 are turned on and off, respectively, and P-MOSFET M11 is turned on, thereby causing node 21 to be low at a logic zero and node 31 to be high at a logic one. This results in P-MOSFETs M3 and M4 being turned off and P-MOSFETs M1 and M2 being turned on. Hence, the programming node 19 is conductively coupled to the output node 11, thereby causing the output voltage VPPOUT to be approximately equal to the programming voltage VPPIN (albeit slightly less due to small voltage drops across the channels of P-MOSFETs M1 and M2).

During the normal mode of operation (TM=0), the programming voltage VPPIN is equal to the power supply voltage VDD and neither branch of the second selective coupling circuit 20 is turned on. Therefore, node 21 is left floating. However, since node 31 is at virtually ground potential, P-MOSFETs M3 and M4 are turned on. Further, even if P-MOSFETs M1 and M2 are turned on, with the programming voltage VPPIN equal to the power supply voltage VDD, the voltage at the output node 11 is still approximately equal to the power supply voltage VDD.

Based upon the foregoing, it can be seen that during the nonprogramming mode of operation, i.e. when the power supply voltage VDD is driving the output node 11, the operation of the second selective coupling circuit 20 keeps transistors M1 and M2 turned off, thereby preventing any induced high voltage at the programming node 19 (e.g. from an ESD event) from reaching the output node 11 and, therefore, protecting any EEPROM memory registers connected thereto.

Figure 2:
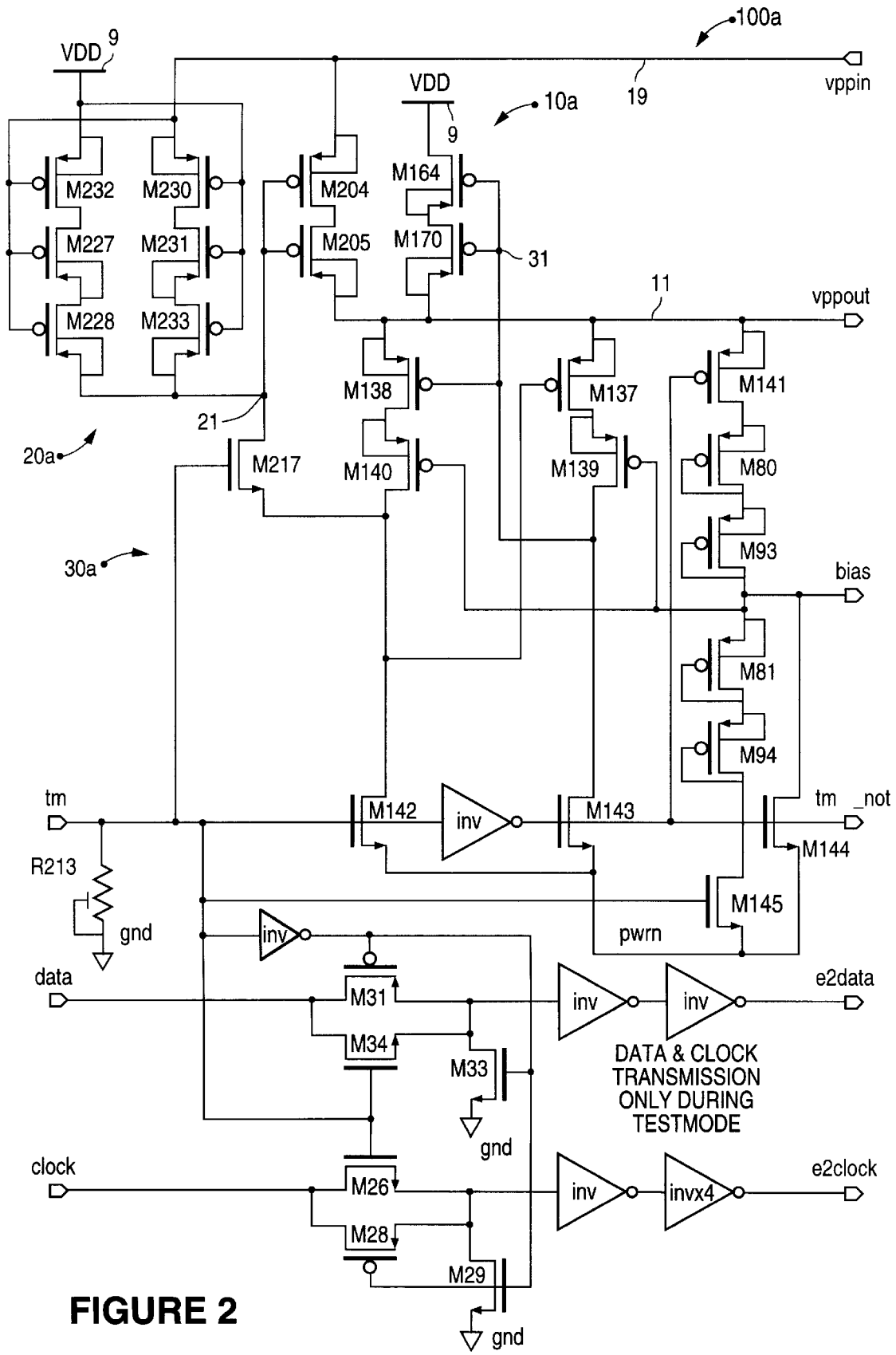
FIG. 2 is a schematic diagram of a voltage selection circuit in accordance with another embodiment of the present invention.

Referring to FIG. 2, a voltage selection circuit 100a in accordance with another embodiment of the present invention includes selective coupling circuits 10a, 20a similar to those shown in FIG. 1 and discussed above. However, the second selective coupling circuit 20a in this embodiment includes three P-MOSFETs in each circuit branch, rather than two. The input voltage selection operation, i.e. whereby the larger of the power supply voltage VDD and programming voltage VPPIN is selected, is unchanged since it is the two upper P-MOSFETs M230, M232 which perform such selection.

In the control circuit 30a, N-MOSFETs M217, M142 and M143 perform the same functions as N-MOSFETs M9 and M10 in FIG. 1. The remaining P-MOSFETs M137–M141, M80, M93, M81, M94, M144 and M145 perform various internal biasing functions and provide a separate bias signal BIAS for use by an electrically erasable latch circuit (discussed in more detail below).

Figure 3A:
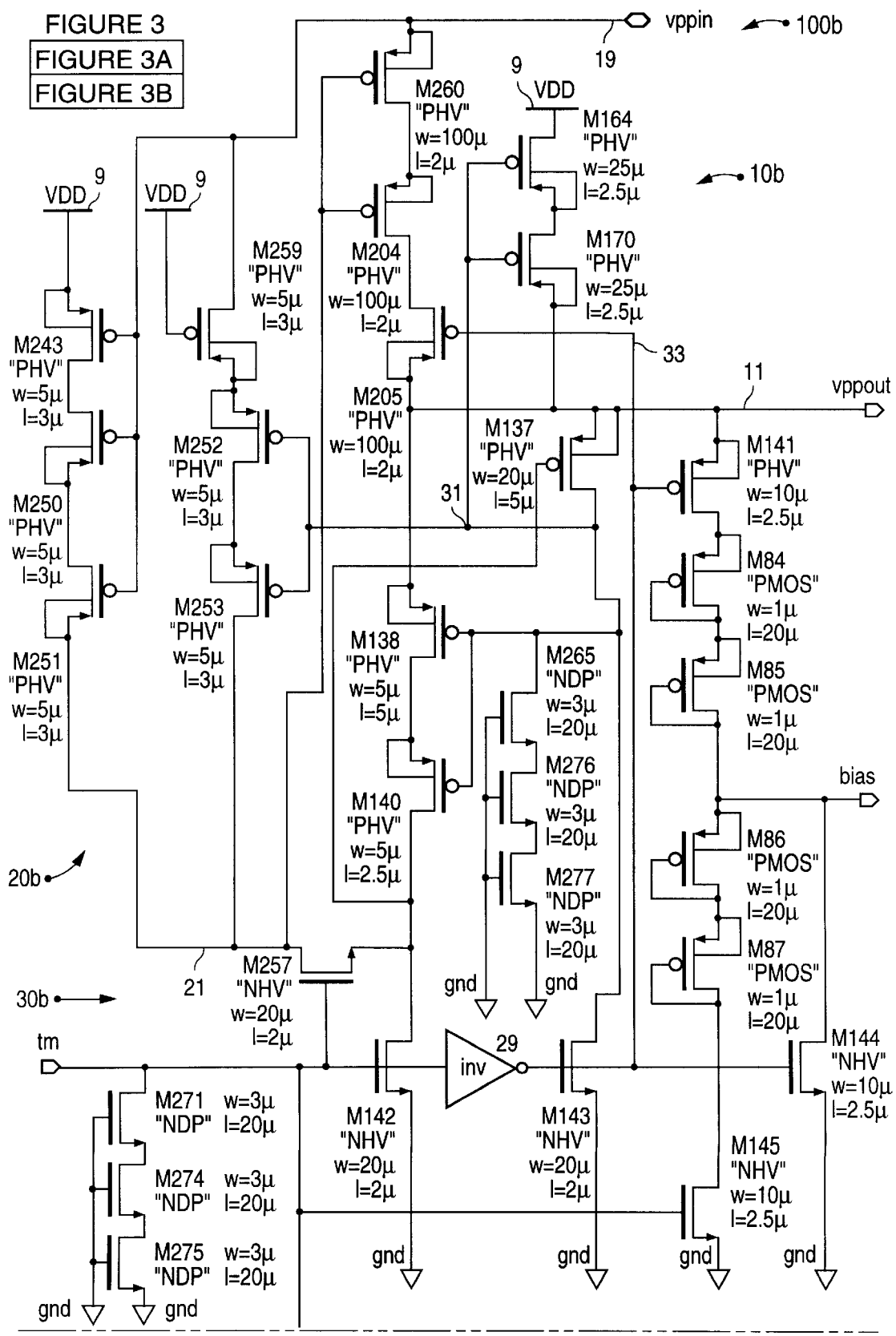
FIG. 3 is a schematic diagram of a voltage selection circuit in accordance with still another embodiment of the present invention.
Figure 3B:
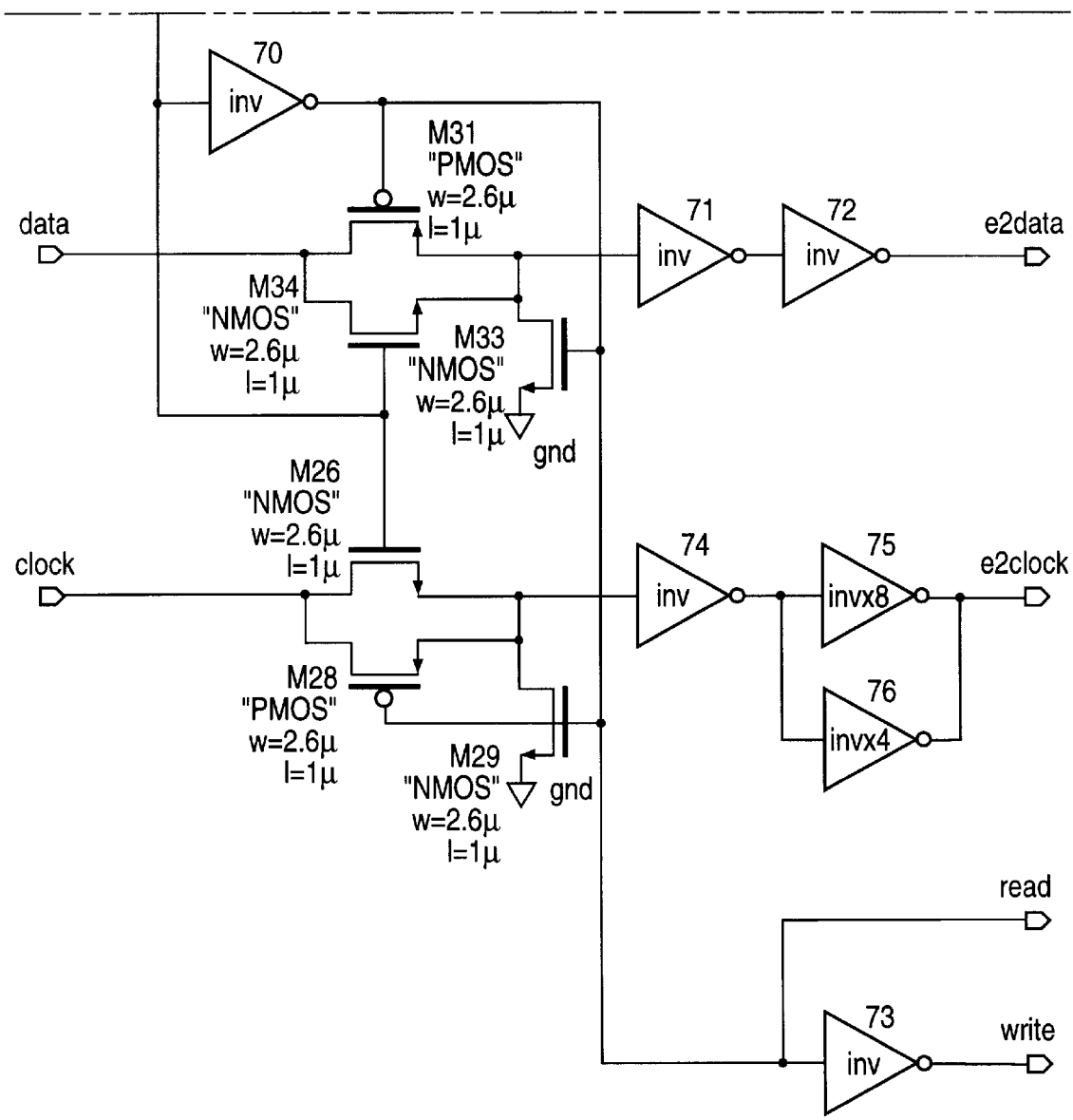

Referring to FIG. 3, a voltage selection circuit 100b in accordance with still another embodiment of the present invention also includes selective coupling circuits 10b, 20b similar to those shown in FIG. 1 and discussed above. However, the first selective coupling circuit 10b includes an additional element and the second selective coupling circuit 20b is driven by an additional control signal.

In the first selective coupling circuit 10b, the second branch includes two P-MOSFETs M260, M204 whose gate terminals are driven by the signals at node 21, plus an additional P-MOSFET M205 whose gate terminal is connected to a node 33 driven by a control signal which is the inverse of that which drives the node 31 connecting the gate terminals of the P-MOSFETs M164, M170 in the first selective coupling circuit 10b. One advantage of having this additional transistor M205 which is driven directly by a signal corresponding to the test mode signal TM is that, when appropriate as determined by the status of the test mode signal TM, it is ensured that the circuit branch in which this transistor M205 is connected is turned off, such as in the event that the programming voltage VPPIN equals the power supply voltage VDD and node 21 is otherwise left floating (as discussed above).

Additionally, two of the P-MOSFETs M252, M253 in one branch of the second selective coupling circuit 20b have their gate terminals interconnected at node 31 to be driven by the same control signal which determines whether the power supply node 9 is conductively coupled to the output node 11 (as discussed above). One advantage of this circuit configuration is that of having less voltage applied across each channel of these three transistors M259, M252, M253 ($V_{DS}$) when they are turned off. Accordingly, this circuit is less process dependent in that, given the fact that P-channel devices cannot handle as much voltage, fabrication of this type of circuit configuration can be accomplished using a wider range of fabrication processes.

In the control circuit 30b, N-MOSFETs M257, M142 and M143 perform the same functions as N-MOSFETs M9 and M10 in FIG. 1. The remaining P-MOSFETs M137, M138, M140, M265, M276, M277, M141, M84, M85, M86, M87, M145 and M144 perform various internal biasing functions and provide a separate bias signal BIAS for use by an electrically erasable latch circuit (discussed in more detail below).

Figure 4:
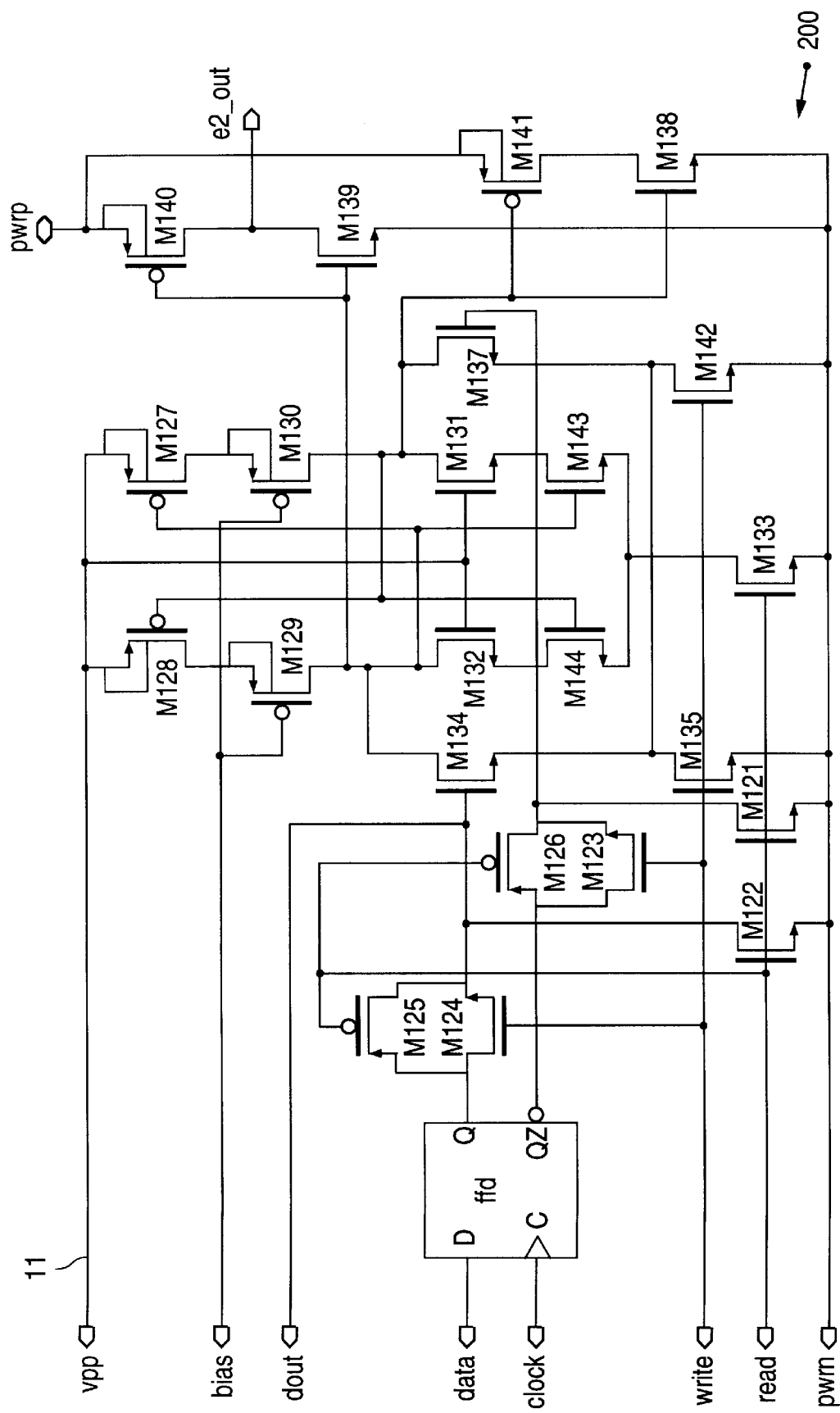
FIG. 4 is a schematic diagram of an electrically erasable latch circuit for which use of a voltage selection circuit in accordance with the present invention is well suited.

Referring to FIG. 4, the above-discussed voltage selection circuits 100, 100a, 100b can be used to drive, i.e. bias and program, an electrically erasable latch circuit 200 such as that depicted. By using multiple latches of this type, an EEPROM circuit can be constructed.

Figure 5:
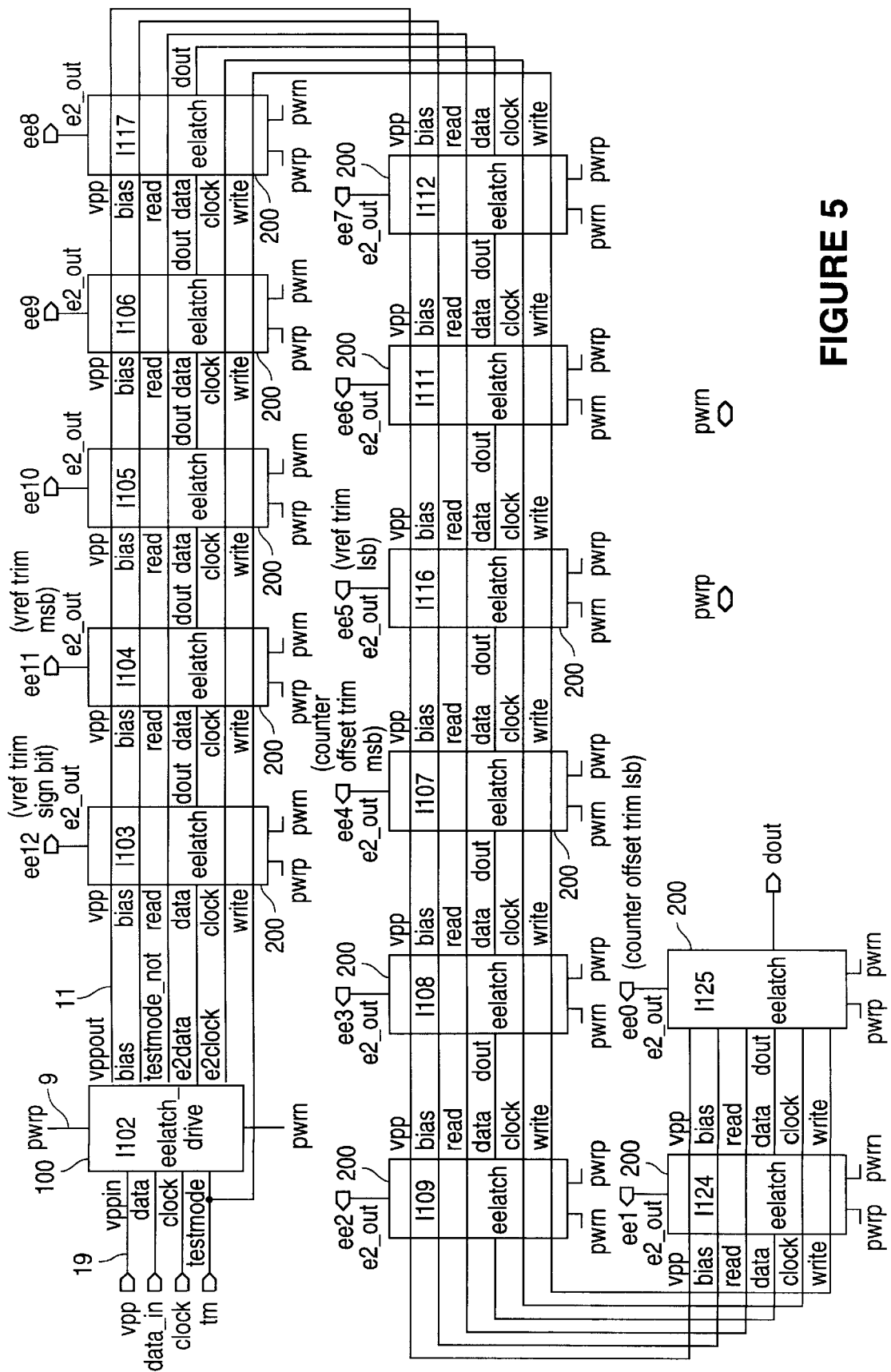
FIG. 5 is a functional block diagram of an EEPROM circuit implementation using a voltage selection circuit in accordance with the present invention.

Referring to FIG. 5, such an EEPROM circuit using a voltage selection circuit 100 in accordance with the present invention and multiple electrically erasable latches 200 can be constructed as shown.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a voltage selection circuit with limited self-controlled input selection capability, said voltage selection circuit comprising:

a first node configured to receive and convey a first voltage;

a second node configured to receive and convey a second voltage;

a third node configured to receive and convey third and fourth voltages for use by a user circuit, wherein said third and fourth voltages correspond to and are approximately equal to said first and second voltages, respectively;

a first selective coupling circuit, connected between said first, second and third nodes, configured to receive first, second and third control signals and in accordance therewith conductively couple said first node to said third node and thereby provide said third voltage thereto or conductively couple said second node to said third node and thereby provide said fourth voltage thereto, wherein said first node is conductively coupled to said third node during assertions of said second and third control signals, and wherein said second node is conductively coupled to said third node during assertion of said first control signal; and a second selective coupling circuit, connected between said first node, said second node and said first selective coupling circuit, configured to receive said first control signal and provide said second control signal, wherein said second control signal corresponds to and is approximately equal to said first voltage when said first voltage is greater than said second voltage, and wherein said second control signal corresponds to and is approximately equal to said second voltage when said second voltage is greater than said first voltage.

2. The apparatus of claim 1, wherein said second selective coupling circuit is disabled during said assertion of said first control signal.

3. The apparatus of claim 1, wherein said first selective coupling circuit comprises:

a first plurality of semiconductor devices, connected between said first and third nodes, configured to receive said third control signal and in accordance therewith conductively couple said first node to said third node and thereby provide said third voltage thereto; and a second plurality of semiconductor devices, connected between said second and third nodes, configured to receive said first and second control signals and in accordance therewith conductively couple said second node to said third node and thereby provide said fourth voltage thereto.

4. The apparatus of claim 3, wherein said first and second pluralities of semiconductor devices comprise first and second pluralities of totem-pole-connected MOS pass transistors.

5. The apparatus of claim 1, wherein said second selective coupling circuit comprises:

a first plurality of semiconductor devices, connected between said first node, said second node and said first selective coupling circuit, configured to receive said first control signal and provide said second control signal when said first voltage is greater than said second voltage; and a second plurality of semiconductor devices, connected between said first node, said second node and said first selective coupling circuit, configured to receive said first control signal and provide said second control signal when said second voltage is greater than said first voltage.

6. The apparatus of claim 5, wherein said first and second pluralities of semiconductor devices comprise first and second pluralities of totem-pole-connected MOS pass transistors.

7. The apparatus of claim 1, wherein said first selective coupling circuit is further configured to receive a fourth control signal and in accordance with said first, second, third and fourth control signals conductively couple said first node to said third node and thereby provide said third voltage thereto or conductively couple said second node to said third node and thereby provide said fourth voltage thereto, wherein said second node is conductively coupled to said third node during assertions of said first and fourth control signals.

8. The apparatus of claim 7, wherein said first selective coupling circuit comprises:

a first plurality of semiconductor devices, connected between said first and third nodes, configured to receive said third control signal and in accordance therewith conductively couple said first node to said third node and thereby provide said third voltage thereto; and a second plurality of semiconductor devices, connected between said second and third nodes, configured to receive said first, second and fourth control signals and in accordance therewith conductively couple said second node to said third node and thereby provide said fourth voltage thereto.

9. The apparatus of claim 8, wherein said first and second pluralities of semiconductor devices comprise first and second pluralities of totem-pole-connected MOS pass transistors.

10. The apparatus of claim 1, wherein said second selective coupling circuit is further configured to receive said third control signal, wherein said second control signal corresponds to and is approximately equal to said second voltage during assertion of said third control signal and when said second voltage is greater than said first voltage.

11. The apparatus of claim 10, wherein said second selective coupling circuit comprises:

a first plurality of semiconductor devices, connected between said first node, said second node and said first selective coupling circuit, configured to receive said first control signal and provide said second control signal when said first voltage is greater than said second voltage; and a second plurality of semiconductor devices, connected between said first node, said second node and said first selective coupling circuit, configured to receive said first and third control signals and provide said second control signal during said assertion of said third control signal and when said second voltage is greater than said first voltage.

12. The apparatus of claim 11, wherein said first and second pluralities of semiconductor devices comprise first and second pluralities of totem-pole-connected MOS pass transistors.

13. An integrated circuit including a static electrostatic discharge (ESD) protection circuit for the programming voltage line of an electrically erasable programmable read only memory (EEPROM), said ESD protection circuit comprising:

a power node configured to receive and convey a power supply voltage;

a programming node configured to receive and convey a programming voltage;

a bias node configured to receive and convey first and second bias voltages for use by an EEPROM, wherein said first and second bias voltages correspond to and are approximately equal to said power supply voltage and said programming voltage, respectively;

a selective coupling circuit, connected between said power node, said programming node and said bias node, configured to receive first, second and third control signals and in accordance therewith conductively couple said power node to said bias node and thereby provide said first bias voltage thereto or conductively couple said programming node to said bias node and thereby provide said second bias voltage thereto, wherein said power node is conductively coupled to said bias node during assertions of said second and third control signals, and wherein said programming node is conductively coupled to said bias node during assertion of said first control signal;

a selective biasing circuit, connected between said power node, said programming node and said selective coupling circuit, configured to receive said first control signal and provide said second control signal, wherein said second control signal corresponds to and is approximately equal to said power supply voltage when said power supply voltage is greater than said programming voltage, and wherein said second control signal corresponds to and is approximately equal to said programming voltage when said programming voltage is greater than said power supply voltage; and a control circuit, coupled to said selective coupling circuit and said selective biasing circuit, configured to receive a mode signal and in accordance therewith provide said first and third control signals.

14. The integrated circuit of claim 13, wherein said selective biasing circuit is disabled during said assertion of said first control signal.

15. The integrated circuit of claim 13, wherein said selective coupling circuit comprises:

a first plurality of semiconductor devices, connected between said power node and said bias node, configured to receive said third control signal and in accordance therewith conductively couple said power node to said bias node and thereby provide said first bias voltage thereto; and a second plurality of semiconductor devices, connected between said programming node and bias node, configured to receive said first and second control signals and in accordance therewith conductively couple said programming node to said bias node and thereby provide said second bias voltage thereto.

16. The integrated circuit of claim 15, wherein said first and second pluralities of semiconductor devices comprise first and second pluralities of totem-pole-connected MOS pass transistors.

17. The integrated circuit of claim 13, wherein said selective biasing circuit comprises:

a first plurality of semiconductor devices, connected between said power node, said programming node and said selective coupling circuit, configured to receive said first control signal and provide said second control signal when said power supply voltage is greater than said programming voltage; and a second plurality of semiconductor devices, connected between said power node, said programming node and said selective coupling circuit, configured to receive said first control signal and provide said second control signal when said programming voltage is greater than said power supply voltage.

18. The integrated circuit of claim 17, wherein said first and second pluralities of semiconductor devices comprise first and second pluralities of totem-pole-connected MOS pass transistors.

19. The integrated circuit of claim 13, wherein said selective coupling circuit is further configured to receive a fourth control signal and in accordance with said first, second, third and fourth control signals conductively couple said power node to said bias node and thereby provide said first bias voltage thereto or conductively couple said programming node to said bias node and thereby provide said second bias voltage thereto, wherein said programming node is conductively coupled to said bias node during assertions of said first and fourth control signals.

20. The integrated circuit of claim 19, wherein said selective coupling circuit comprises:

a first plurality of semiconductor devices, connected between said power node and said bias node, configured to receive said third control signal and in accordance therewith conductively couple said power node to said bias node and thereby provide said first bias voltage thereto; and a second plurality of semiconductor devices, connected between said programming node and said bias node, configured to receive said first, second and fourth control signals and in accordance therewith conductively couple said programming node to said bias node and thereby provide said second bias voltage thereto.

21. The integrated circuit of claim 20, wherein said first and second pluralities of semiconductor devices comprise first and second pluralities of totem-pole-connected MOS pass transistors.

22. The integrated circuit of claim 13, wherein said selective biasing circuit is further configured to receive said third control signal, wherein said second control signal corresponds to and is approximately equal to said programming voltage during assertion of said third control signal and when said programming voltage is greater than said power supply voltage.

23. The integrated circuit of claim 22, wherein said selective biasing circuit comprises:
- a first plurality of semiconductor devices, connected between said power node, said programming node and said selective coupling circuit, configured to receive said first control signal and provide said second control signal when said power supply voltage is greater than said programming voltage; and
- a second plurality of semiconductor devices, connected between said power node, said programming node and said selective coupling circuit, configured to receive said first and third control signals and provide said second control signal during said assertion of said third control signal and when said programming voltage is greater than said power supply voltage.

24. The integrated circuit of claim 23, wherein said first and second pluralities of semiconductor devices comprise first and second pluralities of totem-pole-connected MOS pass transistors.

25. A method for selectively providing an output voltage based upon one of multiple input voltages, said method comprising the steps of:
- receiving and conveying a first voltage via a first node;
- receiving and conveying a second voltage via a second node;
- receiving and conveying third and fourth voltages via a third node for use by a user circuit, wherein said third and fourth voltages correspond to and are approximately equal to said first and second voltages, respectively;
- receiving first, second and third control signals;
- conductively coupling said first node to said third node and thereby providing said third voltage thereto during assertions of said second and third control signals;
- conductively coupling said second node to said third node and thereby providing said fourth voltage thereto during assertion of said first control signal; and generating said second control signal, wherein said second control signal corresponds to and is approximately equal to said first voltage when said first voltage is greater than said second voltage, and wherein said second control signal corresponds to and is approximately equal to said second voltage when said second voltage is greater than said first voltage.

26. The method of claim 25, further comprising the step of disabling said second control signal during said assertion of said first control signal.

27. The method of claim 25, wherein said step of conductively coupling said first node to said third node and thereby providing said third voltage thereto during assertions of said second and third control signals and said step of conductively coupling said second node to said third node and thereby providing said fourth voltage thereto during assertion of said first control signal together comprise:
- receiving said third control signal and in accordance therewith conductively coupling said first node to said third node and thereby providing said third voltage thereto; and
- receiving said first and second control signals and in accordance therewith conductively coupling said second node to said third node and thereby providing said fourth voltage thereto.

28. The method of claim 25, wherein said step of generating said second control signal comprises generating said second control signal during non-assertion of said first control signal.

29. The method of claim 25, further comprising the step of receiving a fourth control signal, wherein said step of conductively coupling said second node to said third node and thereby providing said fourth voltage thereto during assertion of said first control signal comprises conductively coupling said second node to said third node and thereby providing said fourth voltage thereto during assertions of said first and fourth control signals.

30. The method of claim 25, wherein said step of generating said second control signal comprises generating said second control signal in accordance with said third control signal, wherein said second control signal corresponds to and is approximately equal to said second voltage during assertion of said third control signal and when said second voltage is greater than said first voltage.

31. The method of claim 30, wherein said step of generating said second control signal in accordance with said third control signal comprises generating said second control signal during assertion of said third control signal and non-assertion of said first control signal.

* * * * *